United States Patent
Gowda et al.

(10) Patent No.: US 10,453,786 B2
(45) Date of Patent: Oct. 22, 2019

(54) POWER ELECTRONICS PACKAGE AND METHOD OF MANUFACTURING THEREOF

(71) Applicant: General Electric Company, Schenectady, NY (US)

(72) Inventors: Arun Virupaksha Gowda, Rexford, NY (US); Paul Alan McConnelee, Albany, NY (US); Nancy Cecelia Stoffel, Niskayuna, NY (US); Risto Ilkka Tuominen, Tokyo (JP)

(73) Assignee: General Electric Company, Schenectady, NY (US)

( * ) Notice: Subject to any disclaimer, the term of this patent is extended or adjusted under 35 U.S.C. 154(b) by 272 days.

(21) Appl. No.: 15/000,257

(22) Filed: Jan. 19, 2016

(65) Prior Publication Data

US 2017/0207160 A1 Jul. 20, 2017

(51) Int. Cl.
*H01L 23/00* (2006.01)
*H01L 23/31* (2006.01)
(Continued)

(52) U.S. Cl.
CPC .... *H01L 23/49838* (2013.01); *H01L 21/4853* (2013.01); *H01L 23/04* (2013.01);
(Continued)

(58) Field of Classification Search
CPC . H01L 2224/48091; H01L 2924/01079; H01L 2924/14; H01L 2924/01029;
(Continued)

(56) References Cited

U.S. PATENT DOCUMENTS

| 6,020,629 A | 2/2000 | Farnworth et al. |
| 6,400,172 B1 | 6/2002 | Akram et al. |

(Continued)

FOREIGN PATENT DOCUMENTS

| JP | 2010153691 A | 7/2010 |
| JP | 2012039072 A | 2/2012 |

(Continued)

OTHER PUBLICATIONS

Shorey, "Glass Interposer Substrates: Fabrication, Characterization and Modeling," Corning, Incorporated, SiP Global Summit 2013, Sep. 5, 2013.
(Continued)

*Primary Examiner* — Kenneth Parker
*Assistant Examiner* — Long H Le
(74) *Attorney, Agent, or Firm* — Ziolkowski Patent Solutions Group, SC

(57) ABSTRACT

An electronics package is disclosed herein that includes a glass substrate having an exterior portion surrounding an interior portion thereof, wherein the interior portion has a first thickness and the exterior portion has a second thickness larger than the first thickness. An adhesive layer is formed on a lower surface of the interior portion of the glass substrate. A semiconductor device having an upper surface is coupled to the adhesive layer, the semiconductor device having at least one contact pad disposed on the upper surface thereof. A first metallization layer is coupled to an upper surface of the glass substrate and extends through a first via formed through the first thickness of the glass substrate to couple with the at least one contact pad of the semiconductor device.

16 Claims, 10 Drawing Sheets

(51) Int. Cl.

| | | |
|---|---|---|
| *H01L 23/055* | (2006.01) | |
| *H01L 23/498* | (2006.01) | |
| *H01L 21/48* | (2006.01) | |
| *H01L 25/16* | (2006.01) | |
| *H01L 23/04* | (2006.01) | |
| *H01L 23/08* | (2006.01) | |
| *H01L 23/15* | (2006.01) | |
| *H01L 23/538* | (2006.01) | |
| *H01L 25/10* | (2006.01) | |

(52) U.S. Cl.
CPC ............ *H01L 23/055* (2013.01); *H01L 23/08* (2013.01); *H01L 23/15* (2013.01); *H01L 23/3121* (2013.01); *H01L 23/49827* (2013.01); *H01L 23/5384* (2013.01); *H01L 24/19* (2013.01); *H01L 24/32* (2013.01); *H01L 24/83* (2013.01); *H01L 25/105* (2013.01); *H01L 25/16* (2013.01); *H01L 23/49894* (2013.01); *H01L 2224/04105* (2013.01); *H01L 2224/24137* (2013.01); *H01L 2224/24195* (2013.01); *H01L 2224/32225* (2013.01); *H01L 2224/32245* (2013.01); *H01L 2224/73267* (2013.01); *H01L 2224/8384* (2013.01); *H01L 2224/8385* (2013.01); *H01L 2224/9222* (2013.01); *H01L 2224/92144* (2013.01); *H01L 2225/1035* (2013.01); *H01L 2225/1058* (2013.01); *H01L 2924/15153* (2013.01); *H01L 2924/19011* (2013.01); *H01L 2924/19105* (2013.01)

(58) Field of Classification Search
CPC ......... H01L 2224/48247; H01L 23/055; H01L 23/3121; H01L 23/49827; H01L 23/49894; H01L 24/32; H01L 24/83; H01L 21/4853; H01L 25/16; H01L 23/49838; H01L 25/105; H01L 2224/9222; H01L 2224/09
See application file for complete search history.

(56) References Cited

U.S. PATENT DOCUMENTS

| | | |
|---|---|---|
| 6,673,698 B1 | 1/2004 | Lin et al. |
| 7,106,320 B2 | 9/2006 | Onozawa et al. |
| 8,159,061 B2 | 4/2012 | Kawabata et al. |
| 8,207,453 B2 | 6/2012 | Ma et al. |
| 8,567,110 B2 | 10/2013 | Magalhaes Mendes et al. |
| 9,054,063 B2 | 6/2015 | Goh et al. |
| 9,088,206 B2 | 7/2015 | Yiu et al. |
| 2002/0180063 A1 | 12/2002 | Iwaki et al. |
| 2004/0075176 A1 | 4/2004 | Nishioka |
| 2007/0040186 A1 | 2/2007 | Fillion et al. |
| 2008/0202801 A1* | 8/2008 | Tuominen ........... H01L 21/4846 174/260 |
| 2009/0321119 A1 | 12/2009 | Kohara et al. |
| 2012/0133052 A1* | 5/2012 | Kikuchi ............ H01L 23/49827 257/774 |
| 2012/0146177 A1* | 6/2012 | Choi ...................... H01L 25/16 257/528 |
| 2013/0069251 A1* | 3/2013 | Kunimoto ......... H01L 23/49827 257/784 |
| 2013/0214646 A1* | 8/2013 | Kojo ................... H01L 41/0533 310/344 |
| 2014/0029210 A1* | 1/2014 | Gowda ............... H01L 23/5389 361/746 |
| 2014/0238464 A1 | 8/2014 | Vesborg |
| 2014/0264800 A1* | 9/2014 | Gowda ............ H01L 23/49568 257/675 |
| 2014/0374629 A1* | 12/2014 | Huang ................. H04B 10/802 250/551 |
| 2015/0329353 A1* | 11/2015 | Cheng ................... B81C 1/0023 257/415 |

FOREIGN PATENT DOCUMENTS

| | | |
|---|---|---|
| JP | 2014022416 A | 2/2014 |
| JP | 2015126002 A | 7/2015 |

OTHER PUBLICATIONS

Lanagan, "Glass Dielectrics for DC Bus Capacitors," May 15, 2012, Penn State University.

Alias, "Structural and Dielectric Properties of Glass—Ceramic Substrate with Varied Sintering Temperatures," Advanced Physical Technologies, TM Research & Development Sdn. Bhd., TMR&D Innovation Centre, Lingkaran Teknokrat Timur, Cyberjaya, Selangor, Malaysia, 2013, pp. 89-118.

\* cited by examiner

POWER ELECTRONICS PACKAGE AND METHOD OF MANUFACTURING THEREOF

BACKGROUND OF THE INVENTION

Embodiments of the invention relate generally to semiconductor device packages or electronics packages and, more particularly, to a power electronics package that includes an interconnect structure formed of a glass dielectric material.

Power semiconductor devices are semiconductor devices used as switches or rectifiers in power electronic circuits, such as switched mode power supplies, for example. Many power semiconductor devices are used in high voltage power applications and are designed to carry a large amount of current and support a large voltage.

In use, power semiconductor devices are typically mounted to an external circuit by way of a packaging structure, with the packaging structure providing an electrical connection to the external circuit and also providing a way to remove the heat generated by the devices and protect the devices from the external environment. Power semiconductor devices are provided with a number of input/output (I/O) interconnections to electrically connect both sides of a respective semiconductor device to an external circuit. These I/O connections may be provided in the form of solder balls, plated bumps, or wirebond connections. In the case of wirebond packaging, wirebonds are provided that connect bond pads or contact pads provided on the power semiconductor device to a corresponding pad or conductive element at the next level of packaging, which may be a circuit board or leadframe. Most existing power device packaging structures use a combination of wirebonds and a substrate (e.g., a direct bonded copper (DBC) substrate) to provide I/O interconnections to both sides of a respective semiconductor device.

As semiconductor device packages have become increasingly smaller and yield better operating performance, packaging technology has correspondingly evolved from leaded packages to planar build-up packages that incorporate buried or embedded semiconductor devices. The general structure of a prior art planar packaging structure 10 incorporating an embedded power device is shown in FIG. 1. The standard manufacturing process for the POL structure 10 typically begins with placement of one or more power semiconductor devices 12 onto a dielectric layer 14 by way of an adhesive 16 that is applied to dielectric layer using a spin coating technique. POL structure 10 may also include one or more additional die packages, packaged controllers, or other electrical components such as inductors or passive components 18. Dielectric layer 14 is a polyimide or other organic material, such as Kapton for example, which has a coefficient of thermal expansion of approximately 20 ppm/° C. Dielectric layer 14 is provided as a planar prefabricated film or lamination or is formed as a planar layer atop a frame structure (not shown).

Metal interconnects 20 (e.g., copper interconnects) are then electroplated onto dielectric layer 14 to form a direct metallic connection to the power semiconductor devices 12. The metal interconnects 20 may be in the form of a low profile (e.g., less than 200 micrometers thick), planar interconnect structure that provides for formation of an input/output (I/O) system 22 to and from the power semiconductor devices 12.

POL structure 10 also includes a direct bond copper (DBC) substrate 24, which is typically formed from a non-organic ceramic substrate 26 such as, for example, alumina, with upper and lower sheets of copper 28, 30 bonded to both sides thereof via a direct bond copper interface or braze layer 32. The upper copper sheet 28 of DBC substrate 24 is patterned to form a number of conductive contact areas before DBC substrate 24 is attached to semiconductor devices 12. An electrically conductive shim 34 is provided to electrically couple a portion of metal interconnects 20 to DBC substrate 24.

During the fabrication process of POL structure 10, solder 36 is applied to the surfaces of semiconductor devices 12 and shim 34. DBC substrate 24 is then lowered onto solder 36 to align the patterned portions of lower copper sheet 30 with solder 36. After DBC substrate 24 is coupled to semiconductor devices 12 and shim 34, an underfill technique is used to apply a polymeric dielectric material 38 in the space between adhesive layer 16 and DBC substrate 24. While polymeric dielectric material 38 provides some environmental protection for semicondcutor devices 12, the semiconductor devices are not hermetically sealed due to the inherent characteristic of the polymeric material 38 that allows moisture and other gases to diffuse through it.

Advancements in semiconductor chip packaging technology are driven by ever-increasing needs for achieving better performance, greater miniaturization, and higher reliability. Such advancements have led to the development of new semiconductor technologies such as, for example, silicon carbide (SiC) power devices. These new power devices may be operated to switch at high frequencies and at high voltages. However, these devices also operate at elevated temperatures as compared to prior art devices, i.e., at temperatures above 150° C., with temperatures typically in the range of 150 to 250° C. but sometimes exceeding 300° C.

As explained with respect to FIG. 1, existing planar packaging technologies use polyimide and other organic materials for the various dielectric and encapsulating layers within the package structure. While these materials may provide for a planar package structure, polyimide and other organic materials are limited in temperature and reliability at elevated temperatures, as these materials have an upper temperature limit in the range of 150 to 175 degrees Celsius. Ceramic materials such as alumina may also be incorporated into planar packaging structures. However, the high cost and brittle nature of these materials severely limit their capabilities.

To fully utilize the capabilities of these new semiconductor technologies, it would be desirable to provide a new planar packaging technology that maintains reliability at the elevated operating temperatures, frequencies, and voltages of SiC and other high temperature power devices. It would further be desirable for such a packaging technology to hermetically seal the power devices and simplify the current manufacturing process.

BRIEF DESCRIPTION OF THE INVENTION

In accordance with one aspect of the invention, an electronics package includes a glass substrate having an exterior portion surrounding an interior portion thereof, wherein the interior portion has a first thickness and the exterior portion has a second thickness larger than the first thickness. The electronics package further includes an adhesive layer formed on a lower surface of the interior portion of the glass substrate and a semiconductor device having an upper surface coupled to the adhesive layer, the semiconductor device having at least one contact pad disposed on the upper surface thereof. A first metallization layer is coupled to an upper surface of the glass substrate and extends through a first via formed through the first thickness of the glass substrate to couple with the at least one contact pad of the semiconductor device.

In accordance with another aspect of the invention, a method of manufacturing an electronics package includes providing a glass substrate having an interior portion surrounded by an exterior portion, the exterior portion having a thickness greater than a thickness of the interior portion. The method also includes forming an adhesive layer on a lower surface of the interior portion of the glass substrate, coupling an upper surface of a semiconductor device to the glass substrate by way of the adhesive layer, the upper surface comprising at least one contact pad, and forming a first metallization layer on the glass substrate, the first metallization layer extending through at least one via formed through the thickness of the interior portion of the glass substrate to connect to the at least one contact pad of the semiconductor device.

In accordance with yet another aspect of the invention, a power electronics package includes a multi-thickness substrate having at least one via formed through a first thickness thereof and a power device having an active surface coupled to the multi-thickness substrate, the active surface comprising at least one contact pad aligned with the at least one via in the multi-thickness substrate. A first metallization layer is formed on an upper surface of the multi-thickness substrate and extends through the at least one via to contact the at least one contact pad. The difference between the coefficient of thermal expansion of the multi-layer substrate and the coefficient of thermal expansion of the power device is less than approximately 7 ppm/° C.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION

Figure 1:
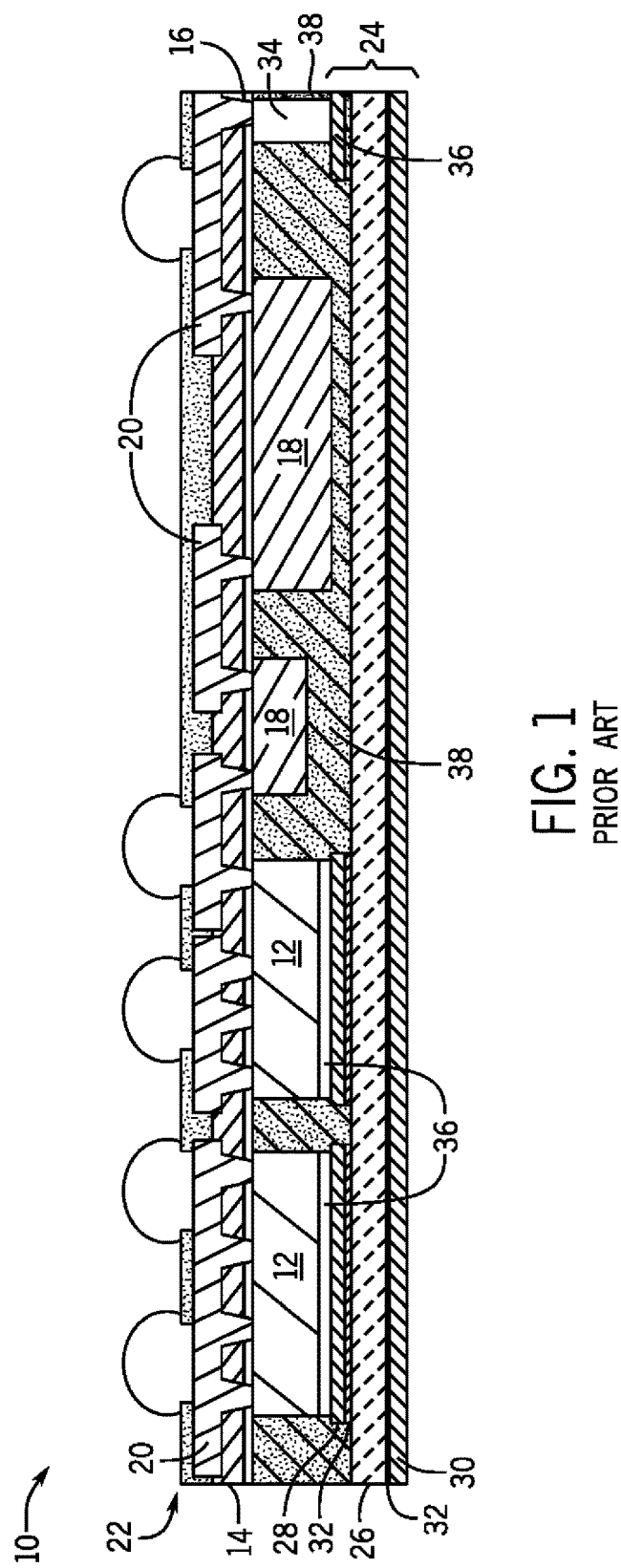
FIG. 1 is a schematic cross-sectional side view of a prior art electronics package incorporating a power device.
Figure 2:
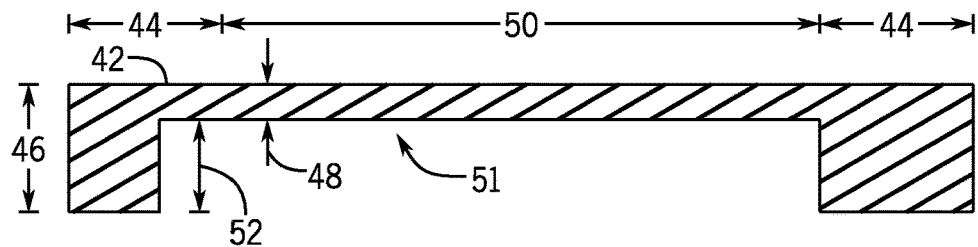
FIGS. 2-9 are schematic cross-sectional side views of an electronics package during various stages of a manufacturing/build-up process according to an embodiment of the invention.

Embodiments of the present invention provide for a method of forming an electronics package that includes a glass substrate having a coefficient of thermal expansion that can be controlled through its composition and that more closely matches that of the semiconductor devices or electronics components than conventional polymeric substrates. Use of the disclosed glass substrate also permits hermeticity or near hermeticity for the devices or components. Embodiments described herein also provide the ability to fully utilize the capability of new semiconductor technologies, such as SiC, and their ability to switch at high frequencies at high voltages and temperatures.

Embodiments of the invention are directed to an electronics package that includes one or more semiconductor devices, dies, or chips embedded within the electronics package. While the semiconductor devices embedded in the electronics package are referenced below in the embodiments of FIGS. 2-20 specifically as power devices, it is understood that other electrical components could be substituted in the electronics package, and thus embodiments of the invention are not limited only to the embedding of power devices in an electronics package. That is, the use of power devices in the electronics package embodiments described below should also be understood to encompass other electrical components such as resistors, capacitors, inductors, filters, or other similar devices, that could be provided in the electronics package either alone or in combination with one or more power devices. Additionally, while the embodiments of FIGS. 2-20 are described as including two power devices and one passive device, it is contemplated that the concepts described herein may be extended to electronics packages that include a single semiconductor device or passive device and to electronics packages that include any other number of semiconductor devices or passive devices, either alone or in combination.

Referring now to FIGS. 2-9, a technique for manufacturing an electronics package 40 is set forth, according to an embodiment of the invention. A cross-section of the build-up process for a singular electronics package 40 is shown in each of FIGS. 2-9 for ease of visualization of the build-up process, however, one skilled in the art will recognize that multiple electronics packages could be manufactured in a similar manner at the panel level and then singulated into individual electronics package components as desired. Also, each of the electronics packages may contain a single die, multiple die, or a combination of one or more die, chips, and passive devices.

Fabrication of electronics package 40 begins with a dielectric layer 42 that is provided in the form of a rigid or flexible glass substrate, with the rigidity/flexibility of the substrate being controllable based on a thickness, composition and manufacturing method thereof. According to various embodiments, dielectric layer 42 has a coefficient of thermal expansion within a range of approximately 3-9 ppm/° C. As shown dielectric layer 42 has a non-planar geometry and multiple thicknesses, with the outer portion 44 of the dielectric layer 42 having a thickness 46 that is larger than the thickness 48 of the interior portion 50 of the dielectric layer 42. In one non-limiting embodiment, thickness 48 is approximately 50 microns, although it is recognized that thicknesses of between 25 and 150 microns would be suitable. As shown, a recess 51 is formed between the outer portion 44 and the interior portion 50 of the dielectric layer 42 as a result of the difference in thickness of the two portions 44, 50. It is contemplated that dielectric layer 14 may also be provided having a constant thickness, according to alternative embodiments. In yet another embodiment, dielectric layer 42 is formed by bonding two layers of glass via a glass-frit bond or other joining method, with an upper layer having thickness 48 and a lower layer of glass having thickness 52.

Figure 3:
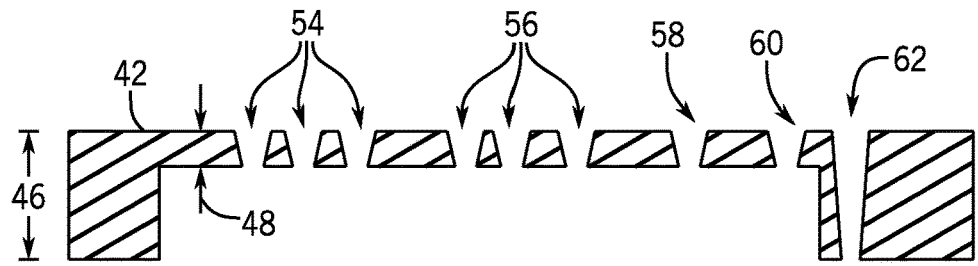

A number of vias 54, 56, 58, 60 are formed through the interior portion 50 of dielectric layer 42 though thickness 48, as shown in FIG. 3. One or more vias 62 may also be formed through the outer portion 44 of dielectric layer 42. Vias 54, 62 may be formed by UV laser drilling or etching, for example. Alternatively, vias 54, 62 may be formed by way of other methods including: plasma etching, dry and wet etching techniques, other laser techniques like CO2 and excimer, or mechanical drilling processes. In one embodiment, vias 50, 62 are formed having angled side surfaces, as shown in FIG. 3, which facilitates later filling and metal deposition.

Figure 4:
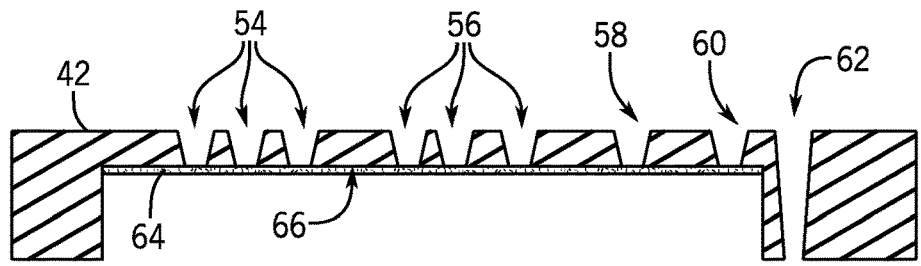

In a next step of the manufacturing process, an adhesive layer 64 is applied to the bottom surface 66 of the interior portion 50 of dielectric layer 42, as shown in FIG. 4. According to the illustrated embodiment, adhesive layer 64 is applied such that it coats the entirety of the bottom surface 66. In alternative embodiments, adhesive layer 64 may be applied to coat only select portions of the bottom surface 66. Adhesive layer 64 may be applied using a coating technique such as spin coating or slot die coating, or may be applied by a programmable dispensing tool in the form of an inkjet printing-type device technique, as non-limiting examples. Adhesive layer 64 is a high temperature adhesive such as, for example, a high temperature polyimide, epoxies, cyanate ester material, or a blend thereof, that is suitable for use at temperatures of 150° C. at a lower limit and 250° C. at an upper limit. It is recognized that other adhesives could also be implemented that are suitable for use at temperatures greater than 250° C., such as at 300° C. or even 400° C., depending on the application.

Figure 5:
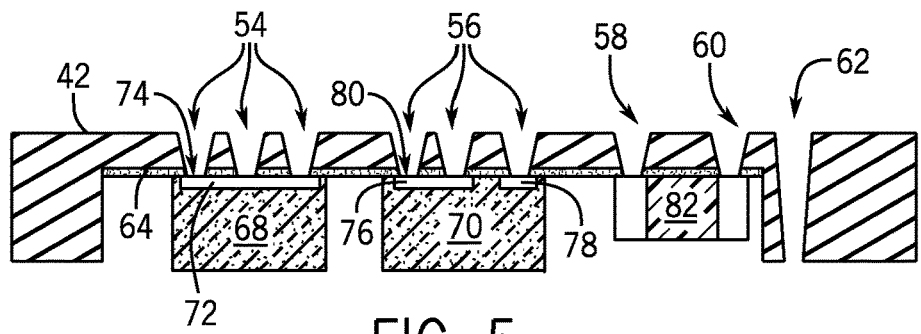

Referring to FIG. 5, one or more semiconductor devices 68, 70 or electronic components are coupled to adhesive layer 64. Semiconductor devices 68, 70 may be of the same thickness, as shown in FIG. 5, or of varying thickness in an alternative embodiment. In one non-limiting embodiment, semiconductor devices 68, 70 have a thickness within a range of approximately 50-500 microns. Semiconductor devices 68, 70 may be generally described as "power devices" or "non-power devices." Thus, semiconductor devices 68, 70 may be in the form of a die, diode, MOSFET, transistor, application specific integrated circuit (ASIC), or processor, as examples. In the illustrated embodiment, semiconductor device 68 is depicted as a diode having a contact pad 72 positioned on an active surface 74 thereof. Semiconductor device 70 is depicted as a MOSFET having a source pad 76 and gate pad 78 positioned on its active surface 80. However, it is recognized that semiconductor devices 68, 70 may be provided as alternative types of power or non-power devices and that a lesser or greater number of semiconductor devices or electronic components may be included within electronics package 40. In one embodiment, semiconductor devices 68, 70 are formed of silicon or silicon carbide (SiC) and have a coefficient of thermal expansion within a range of approximately 2-3 ppm/° C. Optionally, one or more passive devices 82, such as, for example, a resistor, a capacitor, or an inductor, may be placed onto adhesive layer 64. After semiconductor devices 68, 70 and passive device(s) 82 are positioned, adhesive layer 64 may be fully cured, thermally or by a combination of heat or radiation. Suitable radiation may include UV light and/or microwaves. In one embodiment, a partial vacuum and/or above atmospheric pressure may be used to promote the removal of volatiles from the adhesive during cure if any are present. Once cured, any portion of adhesive layer 64 beneath vias 54 is removed using, for example, a reactive ion etching (RIE) or laser process that does not significantly impact the structural integrity of the dielectric layer 42.

Figure 6:
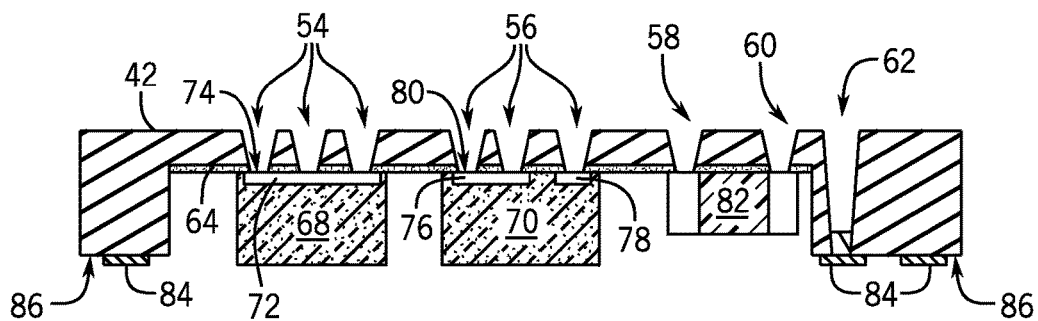
Figure 7:
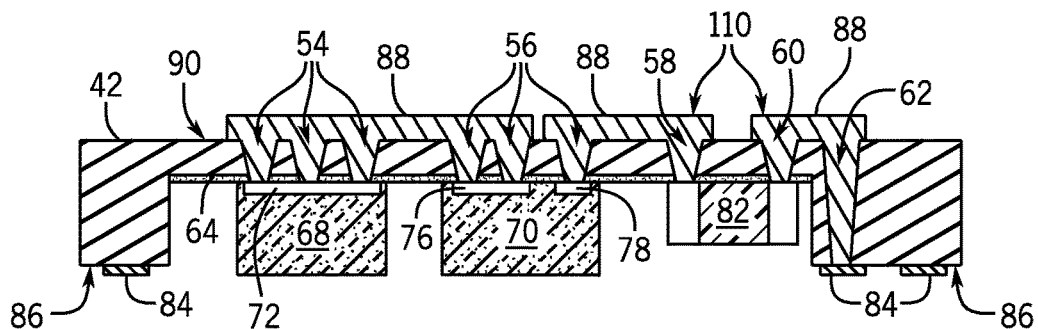

As shown in FIG. 6, a lower metallization layer 84 is formed on a lower surface 86 of the outer portion 44 of dielectric layer 42 in a next step of the fabrication process. Following the application process, a portion of metallization layer 84 may extend up into via 62 as shown. An upper metallization layer 88 is formed on the upper surface 90 of dielectric layer 42, as shown in FIG. 7. Upper metallization layer 88 extends through vias 54 to electrically couple with contact pads 72, 76, 78 of semiconductor devices 68, 70. Upper metallization layer 88 also extends through vias 62 to electrically couple with lower metallization layer 84. Together, the upper metallization layer 88 and lower metallization layer 84 thus form electrical connections between the lower surface 86 and the upper surface 90 of dielectric layer 42. In one embodiment, an optional titanium-copper seed layer (not shown) is sputter-plated onto the upper surface 90 and/or lower surface 86 of dielectric layer 42 prior to deposition of upper and lower metallization layers 84, 90.

Metallization layers 84, 90 may be formed using a sputtering and plating technique, followed by a lithography process. In one embodiment, lower and upper metallization layers 84, 90 are formed of copper. However, it is contemplated that the manufacturing technique of metallization layers 84, 90 may be extended to the use of other electrically conducting materials or a combination of copper and a filling agent. In embodiments that do not include passive device 82, gate pad 78 of semiconductor device 70 may be electrically coupled to lower metallization layer 84 through an extension of upper metallization layer 88 (not shown in FIG. 7) that is coupled to lower metallization layer 84 through via 62.

Figure 8:
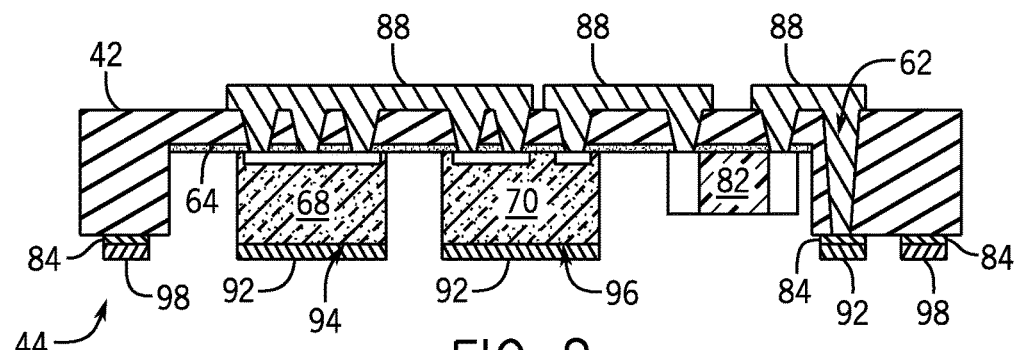

Referring now to FIG. 8, a first joining layer 92 is applied to the respective bottom surfaces 94, 96 of semiconductor devices 68, 70 and to a portion of lower metallization layer 84 aligned with via(s) 62. First joining layer 92 is formed of solder or other high temperature joining material such as sintered silver or other alloys/intermetallics formed using a transient liquid phase bonding technique, with solder such as 92.5Pb/5Sn/2.5Ag or Au—Si being an example of a suitable material. A second joining layer 98 or other high temperature, near-hermetic (i.e., having a helium leak rate of 1E-4 to 1E-6 atm-cc/sec) joining material is applied to lower metallization layer 84 to form a continuous path that surrounds the interior portion 50 of dielectric layer 42. According to various embodiments, second joining layer 98 may be an electrically conductive material or electrically insulative material such as, for example, sintered silver, a transient liquid phase bonding material, or low temperature glass or polymeric systems that exhibit low moisture absorption and diffusion rates (for example, liquid crystalline polymers). When solder is used for second joining layer 98, the bottom surface of the exterior portion of the dielectric layer 42 is metallized.

In some embodiments an optional finish layer (not shown) is provided on the lower metallization layer 84 prior to application of the second joining layer 98. As non-limiting examples, a Ni—Au finish may be used when second joining layer 98 is solder and a Ni—Ag finish may be used when second joining layer 98 is sintered silver. In embodiments where the bottom surfaces of semiconductive devices 68, 70 are metalized, the first and second joining layers 92, 98 may be formed of the same material.

Figure 9:
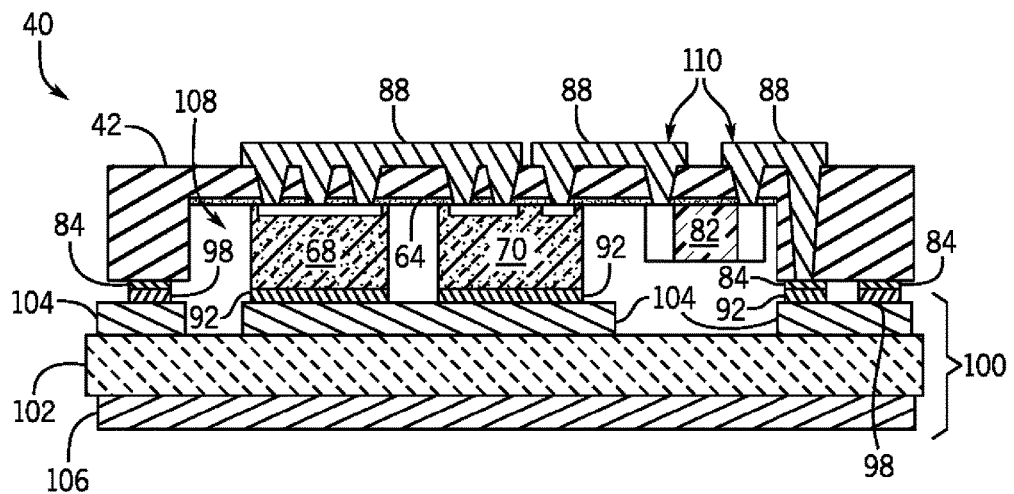

Next, a conductive substrate 100 is coupled to the first and second joining layers 92, 98 using an appropriate welding or bonding process to form an electronics package 40, as shown in FIG. 9. In the illustrated embodiment, conductive substrate 100 is a multi-layer substrate 100 that includes a layer of ceramic substrate 102, such as, for example, alumina, sandwiched between upper and lower sheets 104, 106 formed from an electrically conductive material such as, for example, copper. As shown in FIG. 9, portions of upper sheet 104 are removed to create a patterned upper surface for multi-layer substrate 100. In an alternative embodiment, either or both of first and second joining layers 92, 98 may be initially applied to the multi-layer substrate 100 rather than to the lower metallization layer 84 and semiconductor devices 68, 70. In yet another alternative embodiment, second joining layer 98 may be applied to directly couple multi-layer substrate 100 to dielectric layer 42 after semiconductor devices 68, 70 are coupled to multi-layer substrate 100, thereby creating an edge seal around the interior cavity 108 surrounding semiconductor devices 68, 70 and passive device(s) 82. In such an embodiment, the portion of lower metallization layer 84 shown positioned between dielectric layer 42 and second joining layer 98 may be omitted, as described in more detail with respect to FIG. 19. According to one embodiment, multi-layer substrate 100 is a direct bond copper (DBC) substrate. In an alternative embodiments, substrate 100 is a metal leadframe, such as, for example, copper, that may be molded or encapsulated.

While not shown in FIG. 9, it is contemplated that any number of input/output (I/O) connections may be formed atop upper metallization layer 88 and/or multi-layer substrate 100 such that electrical connections may be made between the electrical components within electronics package 40 and external components (not shown) such as, for example, a busbar or printed circuit board (PCB). Such I/O connections may be provided in the form of plated bumps, pillar bumps, copper straps, Cu terminals directly bonded or solder joined, or wirebond connections/pads, as non-limiting examples. A solder mask may be applied to support some of the I/O connection methods mentioned above.

Figure 10:
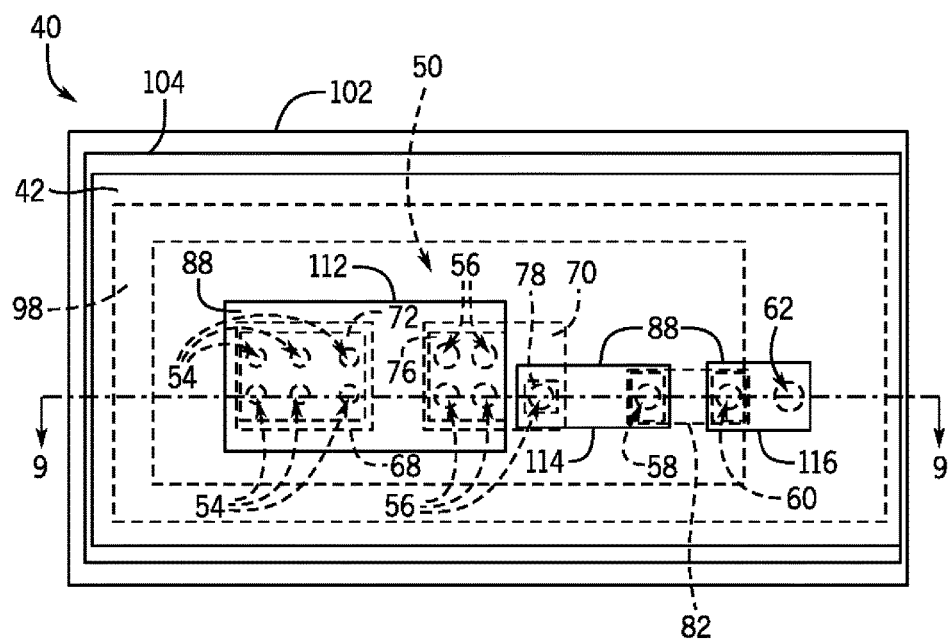
FIG. 10 is a schematic top view of an electronics package manufactured according to the process illustrated in FIGS. 2-9.

A top view of electronics package 40 is provided in FIG. 10 to more clearly illustrate how second joining layer 98 is positioned to surround the interior portion 50 of dielectric layer 14 and semiconductor devices 68, 70 and passive device(s) 82 coupled thereto. In one embodiment, second joining layer 98 hermetically seals the cavity 108 surrounding semiconductor devices 68, 70 and passive device(s) 82. Cavity 108 may then be filled with dry air, or an inert gas such as argon or nitrogen as non-limiting examples. In alternative embodiments, second joining layer 98 is applied to surround and seal a subsection of the interior portion 50 of dielectric layer 14. For example, passive device 82 may be positioned outside the hermetic seal of cavity 108 or may be omitted entirely.

In embodiments where second joining layer 98 does not hermetically seal cavity 108, semiconductor devices 68, 70 and passive device(s) 82 may be overcoated with an encapsulant (not shown) in the form of a non-conductive material such as, for example, a polymer, that fills cavity 108. Encapsulant may be used, for example, in high voltage applications to prevent arcing between semiconductor devices and metal components or to provide rigidity and ease of handling. In another alternative embodiment, passive device(s) 82 may be positioned on a top surface 110 of upper metallization layer 88.

FIG. 10 illustrates an exemplary arrangement of upper metallization layer 88 and vias 54, 56, 58, 62 with respect to semiconductor devices 68, 70 and passive device(s) 82. As shown, a first portion 112 of upper metallization layer 88 is positioned above vias 54 and vias 56 and, therefore electrically coupled to contact pad 72 of semiconductor device 68 and source pad 76 of semiconductor device 70. A second portion 114 of upper metallization layer 88 is aligned with the via 56 that is electrically coupled to gate pad 78 of semiconductor device 70 and via 58 of passive device 82. Likewise, a third portion 116 of upper metallization layer 88 forms an electrical connection between passive device 82 and lower metallization layer 84 through via 60 and via 62.

It is contemplated that an electronics subpackage including dielectric layer 42, adhesive layer 64, and one or both of lower metallization layer 84 and upper metallization layer 88 may be manufactured as a pre-fabricated module with or without semiconductor devices 68, 70 and passive device(s) 82. In an embodiment where the electronics subpackage is manufactured without semiconductor devices 68, 70 and passive device(s) 82, adhesive layer 64 may be provided in a partially cured state (e.g., as a B-stage material) that is stable enough for further handling or transport. This will permit semiconductor devices 68, 70 and passive device(s) 82 to be subsequently attached to the electronics subpackage in a later processing step.

The order and sequence the process or method steps associated with the above-described manufacturing or build-up technique of electronics package 40 may be varied according to alternative embodiments. As one non-limiting example, adhesive layer 64 may be applied prior to formation of vias 54-62. Additionally, lower metallization layer 84 may be formed on the lower surface 86 of dielectric layer 42 prior to positioning semiconductor devices 68, 70 and passive device 82 or even prior to application of adhesive layer 64.

Figure 11:
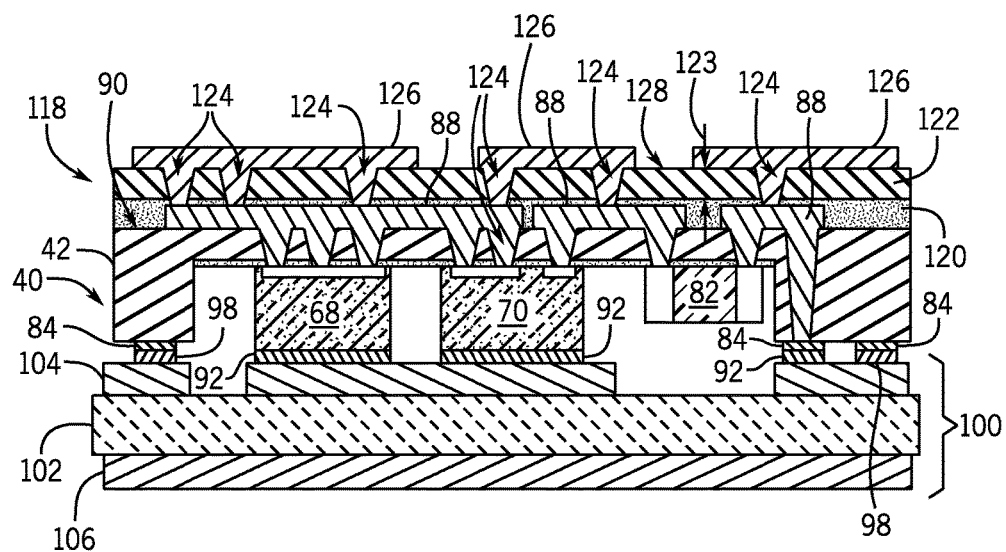
FIG. 11 is a schematic cross-sectional side view of an electronics package according to another embodiment of the invention.

Optionally, an additional build-up layer 118 may be coupled to upper metallization layer 88, as shown in FIG. 11. In one embodiment, build-up layer 118 is formed by applying a layer of adhesive 120 to the top surface 90 of dielectric layer 42 and to upper metallization layer 88 and then placing an upper dielectric layer 122 onto adhesive 120, although it is recognized that the build-up layer 118 could be one single layer that acts as an adhesive and film to metallize or two layers—an adhesive and a non-flowing film. The build-up layers could be polymeric or glass. In the illustrated embodiment, upper dielectric layer 122 has a uniform or substantially uniform thickness 123 throughout. Similar to dielectric layer 42, upper dielectric layer 122 is a glass substrate having a number of vias 124 formed through a thickness thereof. In an alternative embodiment, upper dielectric layer 122 may be a polyimide material, such as Kapton for example. In such an alternative embodiment, upper dielectric layer 122 may be applied as a film or lamination and later etched to form vias 124.

A metallization layer 126 is formed on a top surface 128 of upper dielectric layer 122 and extends through vias 124 to electrically connect with upper metallization layer 88. Similar to upper metallization layer 88, metallization layer 126 may comprise an electrically conductive material such as, for example, copper, and may be formed using a sputtering and plating technique, followed by a lithography process. Additional redistribution layers may be formed atop redistribution layer 118 based on design specifications.

Figure 12:
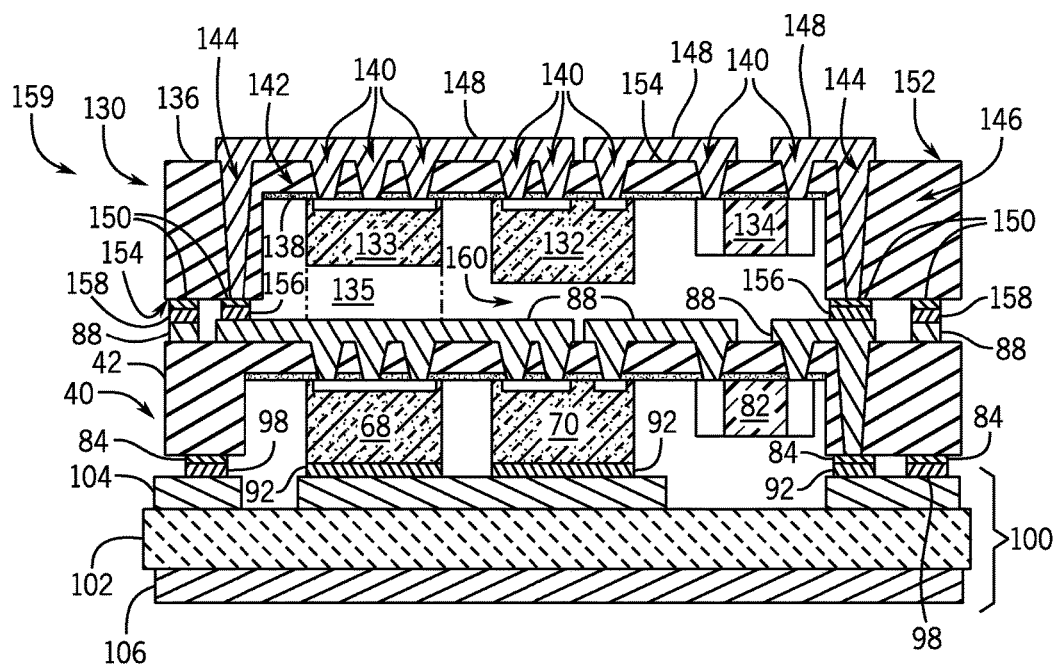
FIG. 12 is a schematic cross-sectional side view of an electronics package according to another embodiment of the invention.

FIG. 12 illustrates an alternative embodiment of an electronics package 159 having a stacked arrangement, wherein an electronics package submodule 130 including one or more semiconductor devices 132, 133 and passive devices 134 and an upper layer dielectric substrate 136 is coupled to electronics package 40. In one embodiment, semiconductor device 133 is a power semiconductor device having backside connections that are electrically coupled to the upper metallization layer 88 of an optional electrically conducting shim 135 (shown in phantom). Upper layer dielectric substrate 136 is a glass substrate constructed in a similar manner as described above for dielectric layer 42 and is coupled to devices 132, 133, 134 by way of an adhesive layer 138. Upper layer dielectric substrate 136 is provided having one or more vias 140 that extend through an interior portion 142 of the substrate 136 and one or more vias 144 that extend through an outer portion 146 thereof. An upper metallization layer 148 and a lower metallization layer 150, similar to upper metallization layer 88 and lower metallization layer 84, are formed on respective top and bottom surfaces 152, 154 of upper layer dielectric substrate 136.

A joining layer 156 electrically connects the lower metallization layer 150 of electronics package submodule 130 to the upper metallization layer 88. Similar to first joining layer 92, joining layer 156 is solder or another electrically conductive, high temperature joining material such as, for example, sintered silver. Another joining layer 158 extends around the outer perimeter of the outer portion 146 of upper layer dielectric substrate 136 between lower metallization layer 150 of electronics package submodule 130 and upper metallization layer 88. According to alternative embodiments, either joining layer 158 or joining layer 98 is hermetic, depending on the application. In one embodiment, joining layer 158 creates a hermetic, or near-hermetic seal within the cavity 160 surrounding devices 132, 134.

Figure 13:
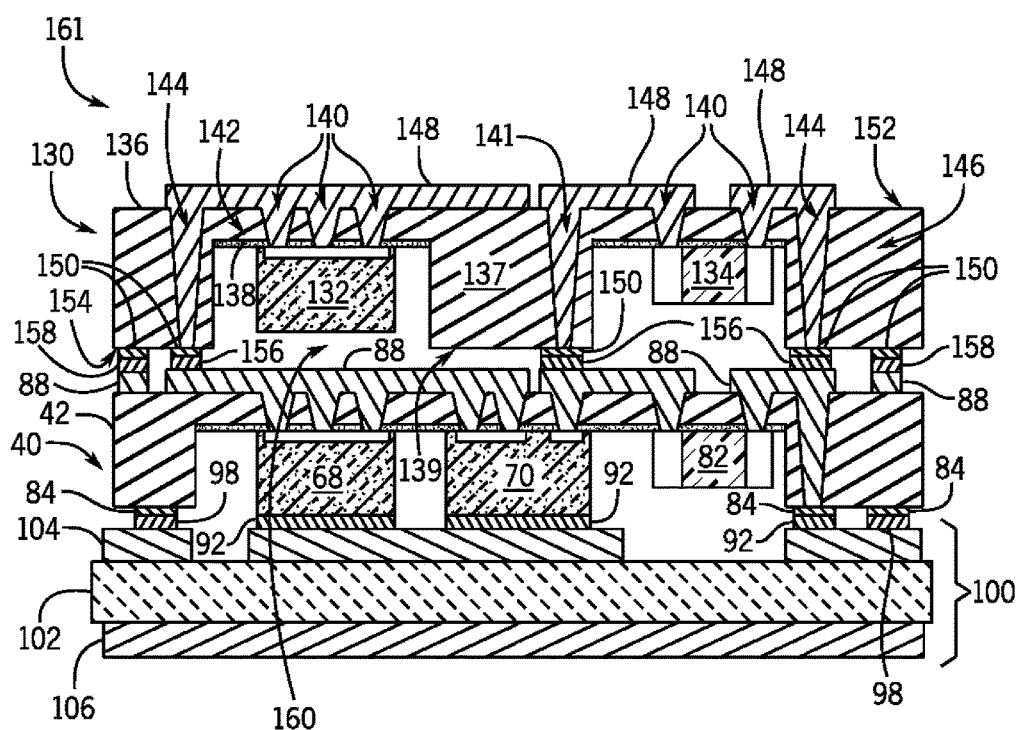
FIG. 13 is a schematic cross-sectional side view of an electronics package according to another embodiment of the invention.

An electronics package 161 is illustrated in FIG. 13 according to an alternative embodiment of the invention. Similar to electronics package 159 of FIG. 12, electronics package 161 includes two electronics package submodules 40, 130, which are arranged in a stacked arrangement. Other common components between electronics package 161 and electronics package 159 are illustrated relative to the same reference numbers as appropriate. In the embodiment of FIG. 13, the upper layer dielectric substrate 136 includes a central post 137, which extends downward into cavity 160. A portion of lower metallization layer 150 is formed on a bottom surface 139 of the central post 137. A via 141 extends through the thickness of central post 137 and is metalized in a similar manner as via 144 to electrically connect upper metallization layer 148 to lower metallization layer 150.

Figure 14:
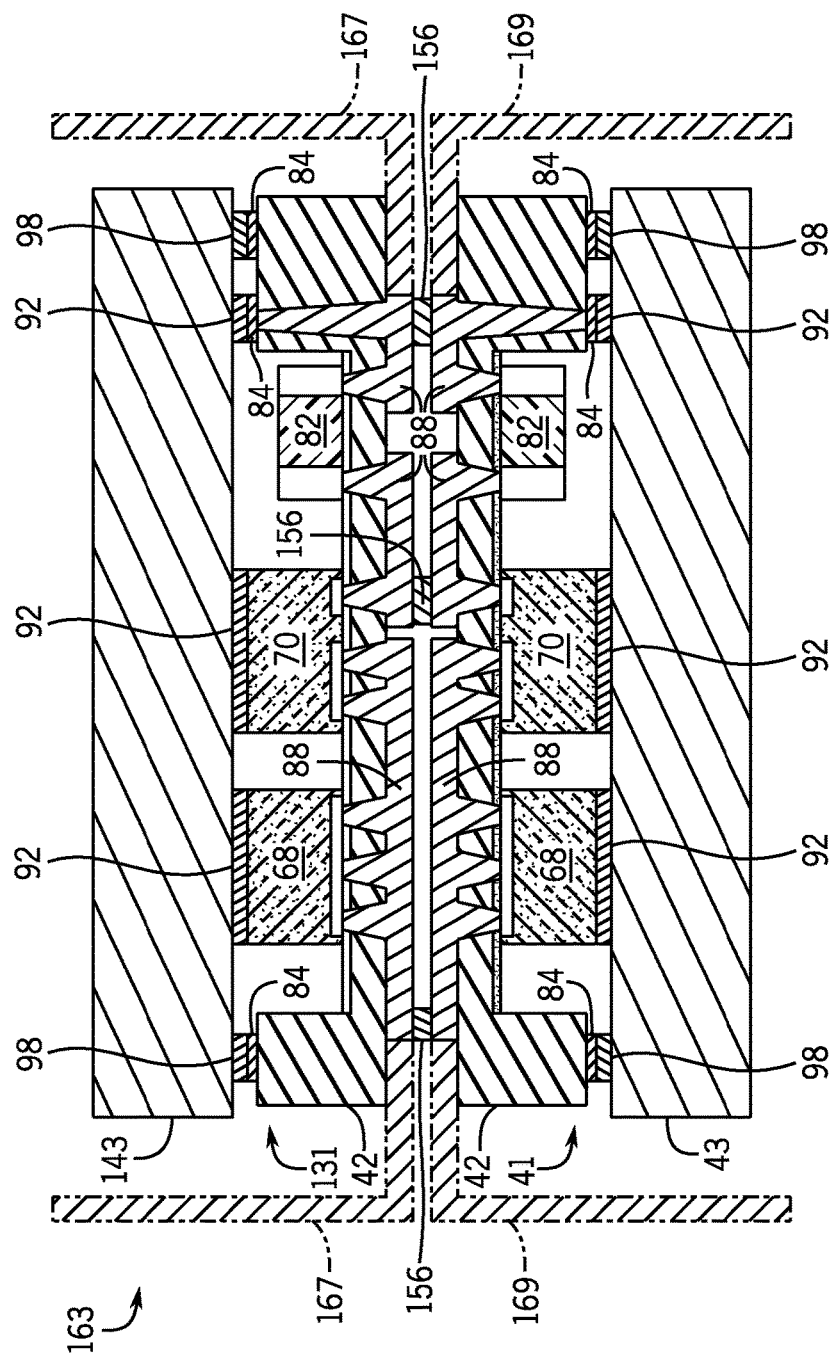
FIG. 14 is a schematic cross-sectional side view of an electronics package according to another embodiment of the invention.

FIG. 14 illustrates an electronics package 163 according to another embodiment of the invention, which includes two electronics package submodules 41, 131 arranged in a stacked configuration. As with the embodiments described above, components common to electronics package 163 and electronics package 159 (FIG. 12) are referenced with the common reference numbers as appropriate. As shown in FIG. 13, electronics package submodule 131 is inverted atop electronics package submodule 41 with their opposing upper metallization layers 88 electrically connected to one another with a joining layer 156. Each electronics package submodule 41, 131 includes a respective thermally and electrically conductive substrate 43, 143 that is coupled to semiconductor devices 68, 70 and lower metallization layer 88 by way of joining layers 92, 98 as shown. According to various embodiments, either of both of conductive substrates 43, 143 may be an encapsulated metal lead frame or a multi-layer substrate such as, for example, a DBC substrate or printed circuit board (PCB). In one non-limiting embodiment, conductive substrate 43 is a DBC substrate and conductive substrate 143 is a PCB. Either or both of conductive substrates 43, 143 may further include a heat sink (not shown) to facilitate cooling of semiconductor devices 68, 70. Such a configuration is especially advantageous in embodiments where semiconductor devices 68, 70 are power devices as it allows for double-sided cooling of electronics package 163. Optionally, electronics package 163 includes input/output (I/O) connections 167 (shown in phantom) and/or downward-facing I/O connections 169 (also shown in phantom), which are electrically connected to semiconductor devices 68, 70 through lower metallization layer 88. I/O connections 167, 169 may be configured as metal (e.g., copper) lead frame connections or other known form of I/O connection according to alternative embodiments.

According to various embodiments, electronics package submodules 41, 131 may both be configured in a similar manner as power modules having one or more semiconductor devices 68, 70 and one or more other circuit components such as passive devices 82 as illustrated in FIG. 14. In alternative embodiments, electronics package submodules 41, 131 may be provided having differing configurations. As one non-limiting example, electronics package submodule 41 may be configured as a power module in a similar manner to that illustrated in FIG. 14 while electronics package submodule 131 may be configured as a control circuit.

Figure 15:
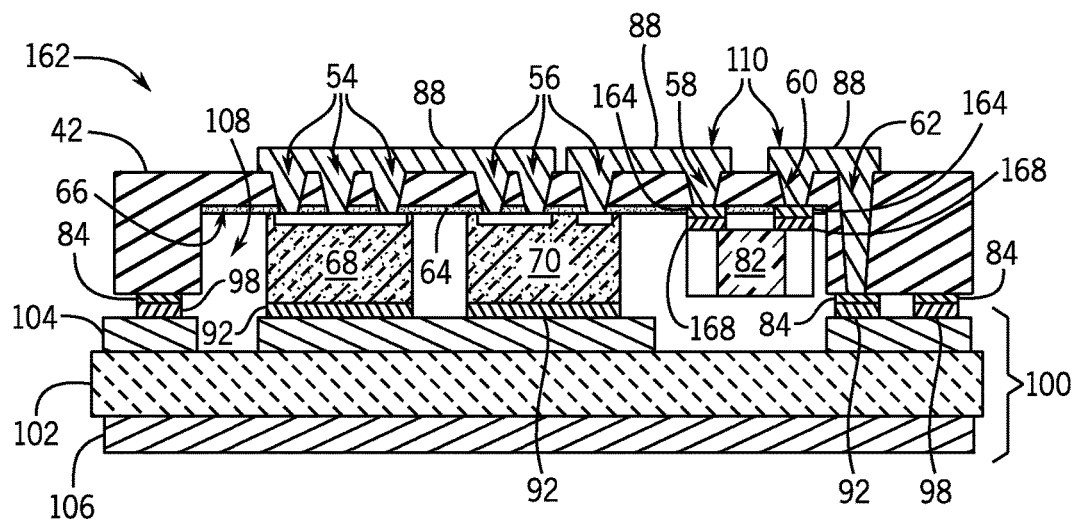
FIG. 15 is a schematic cross-sectional side view of an electronics package according to yet another embodiment of the invention.

Referring now to FIG. 15, an electronics package 162 is shown according to an alternative embodiment. Electronics package 162 and electronics package 40 (FIG. 9) share a number of common components, which will be discussed and illustrated relative to the same reference numbers as appropriate. Similar to electronics package 40, electronics package 162 includes a dielectric layer 42 in the form of a glass substrate having an adhesive layer 64 formed on a bottom surface 66 thereof. Upper metallization layer 88 extends through vias 54, 58 to electrically connect to semiconductor devices 68, 70, which are coupled to adhesive layer 64. A portion of upper metallization layer 88 extends through via 62 and is electrically coupled with lower metallization layer 84. Lower metallization layer 84 extends around the perimeter of dielectric layer 42 and is coupled to multi-layer substrate 100 by way of a second joining layer 98, which may hermetically seal cavity 108 according to various embodiments. A first joining layer 92 couples semiconductor devices 68, 70 and lower metallization layer 84 to multi-layer substrate 100.

In addition to the components common to electronics package 40 (FIG. 9), electronics package 162 includes a metallization layer 164 formed on the bottom surface 66 of the interior portion 50 of dielectric layer 42. Similar to metallization layers 84, 90, metallization layer 164 is an electrically conductive material such as, for example, copper, and may be formed using a sputtering and plating technique, followed by a lithography process. A joining material 168 mechanically and electrically couples passive device 82 to metallization layer 164. According to various embodiments, joining material 168 may be solder, sintered silver, a conductive adhesive such as a polymer filled with an electrically conductive filler such as silver, or another electrically conductive material able to withstand high temperatures. In one embodiment, joining material 168 is used to couple passive device 82 to metallization layer 164 using a liquid phase bonding joining technique.

Figure 16:
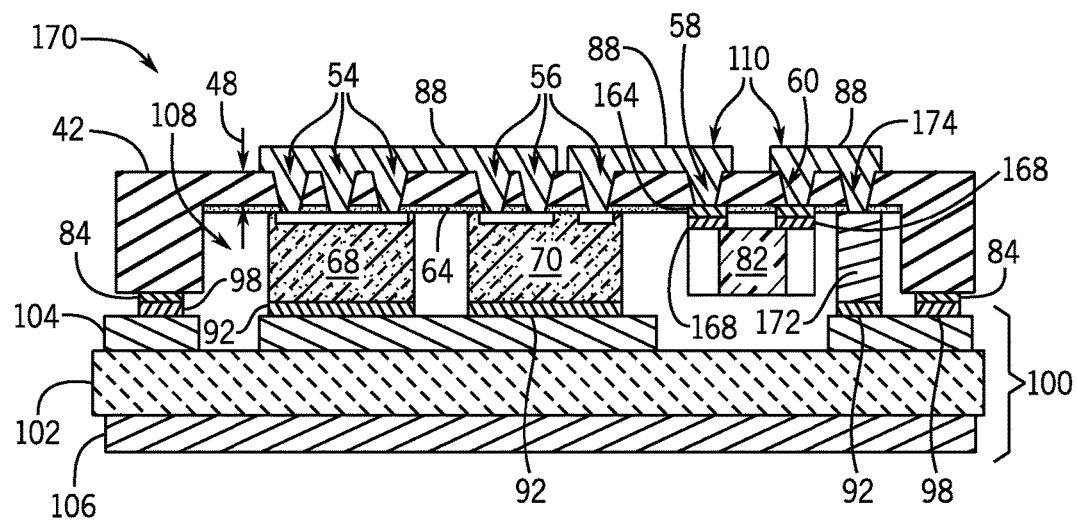
FIG. 16 is a schematic cross-sectional side view of an electronics package according to yet another embodiment of the invention.

FIG. 16 illustrates an electronics package 170 according to another alternative embodiment. Electronics package 170 includes similar components as electronics package 162 of FIG. 15, except that the via 62 and portion of upper metallization layer 88 extending through via 62 of electronics package 162 is replaced by an electrically conductive shim 172 in electronics package 170. According to various embodiments, conductive shim 172 may be copper or another electrically conductive metallic material. As shown in FIG. 16, a portion of upper metallization layer 88 extends through a via 174 formed through the thickness 48 of dielectric layer 42 and adhesive layer 64 and is coupled with conductive shim 172. A portion of first joining layer 92 electrically and mechanically couples conductive shim 172 to multi-layer substrate 100.

Figure 17:
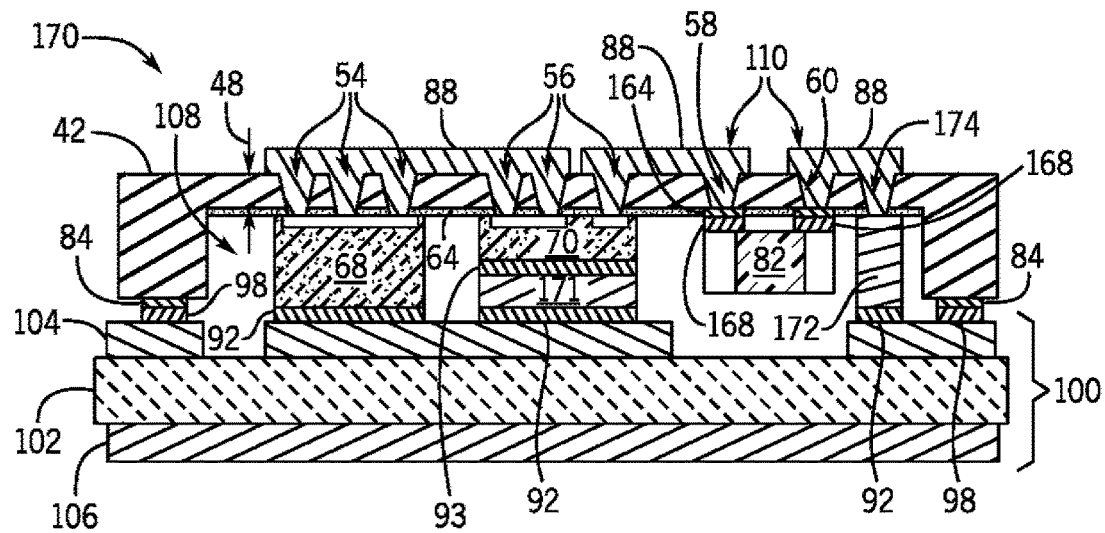
FIG. 17 is a schematic cross-sectional side view of an electronics package according to yet another embodiment of the invention.
Figure 18:
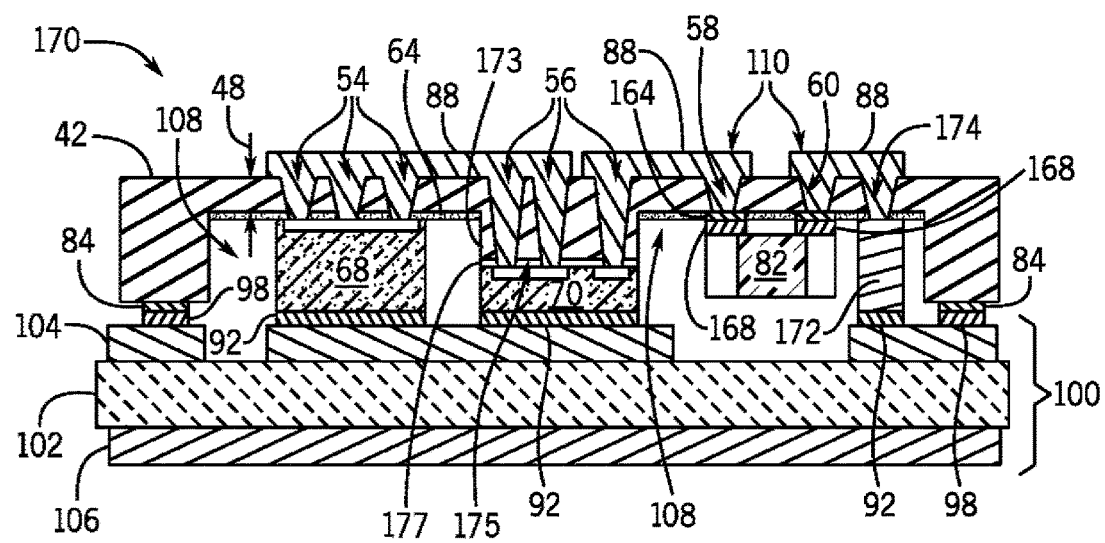
FIG. 18 is a schematic cross-sectional side view of an electronics package according to yet another embodiment of the invention.

FIGS. 17 and 18 illustrate electronics package 170 according to alternative embodiments where semiconductor devices 68, 70 are of differing heights or thicknesses. In the embodiment illustrated in FIG. 17, an electronically conductive shim 171 is provided to offset the height difference between semiconductor devices 68, 70 and is coupled to semiconductor device 70 with a layer of solder 93 or other electically condcutive joining material. In the embodiment illustrated in FIG. 18, dielectric layer 42 is provided having a central post 173 that extends downward into cavity 108. Semiconductor device 70 is coupled to a bottom surface 175 of central post 173 with an adhesive layer 177, similar to adhesive layer 64.

Figure 19:
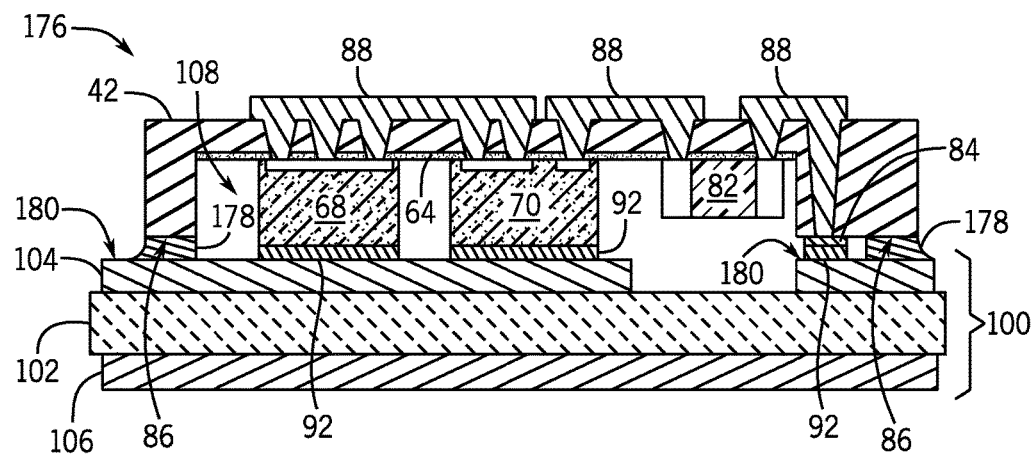
FIG. 19 is a schematic cross-sectional side view of an electronics package according to yet another embodiment of the invention.

Referring now to FIG. 19, an electronics package 176 is shown according to another embodiment of the invention. Again, electronics package 176 includes a number of components similar to those described with respect to electronics package 40 (FIG. 9), and corresponding part numbers are referred to herein as appropriate. While passive device 82 is shown directly coupled to adhesive layer 64 in FIG. 19, it is contemplated that a metallization layer 164 (FIG. 15) and joining material 168 (FIG. 15) may be used to couple passive device 82 to dielectric layer 42 in alternative embodiments.

In addition to the components common to electronics package 40 (FIG. 9), the electronics package 176 shown in FIG. 19 includes a joining layer 178 that directly couples the lower surface 86 of dielectric layer 42 to the upper surface 180 of upper copper sheet 104 of multi-layer substrate 100. Joining layer 178 is a high temperature joining material such as, for example, glass frit or polymers that provide low diffusion characteristics—such as liquid crystalline polymers. In one embodiment, joining layer 178 is applied after the semiconductor devices 68, 70 are coupled to the multi-layer substrate 100 through a dispense and cure method. Joining layer 178 may be applied having a filleted outward facing surface, as shown in FIG. 19.

Figure 20:
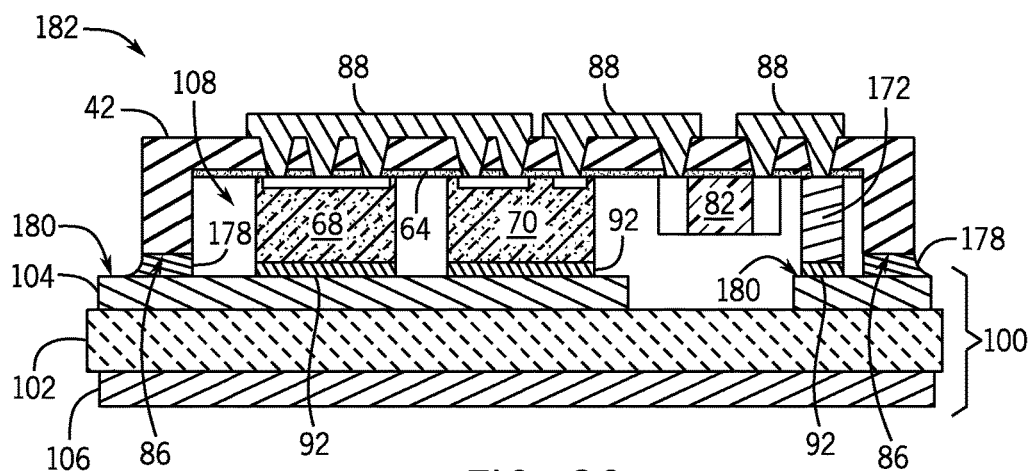
FIG. 20 is a schematic cross-sectional side view of an electronics package according to yet another embodiment of the invention.

FIG. 20 illustrates an electronics package 182 that includes a joining layer 178 according to an alternative embodiment of the invention. Components common between electronics package 182, electronics package 170, and electronics package 40 (FIG. 9) and are discussed with reference to the same part numbers as appropriate. In the embodiment of FIG. 20, the lower metallization layer 84 of FIG. 9 is omitted entirely. Semiconductor devices 68, 70 and conductive shim 172 are directly coupled to upper copper sheet 104 of multi-layer substrate 100. A hermetic or near-hermetic seal is formed surrounding the perimeter of cavity 108 by applying joining layer 178 between lower surface 86 of dielectric layer 42 and upper copper sheet 104. As shown, joining layer 178 may be formed having a filleted outward facing surface. In this embodiment the combined use of conductive shim 172 and first joining layer 92 alleviate the need for a metallization layer similar to lower metallization layer 84 (FIG. 9) on the lower surface 86 of dielectric layer 42.

Accordingly, embodiments of the invention include an electronics package having a dielectric layer provided in the form of a glass substrate having a coefficient of thermal expansion that is a close match to that of the SiC or other high temperature semiconductor device(s) included within the electronics package. The close match between the coefficients of thermal expansion minimize heat-induced stress within the electronics package and improve package reliability, characteristics that are particularly desirable where SiC and other semiconductor devices are incorporated into the electronics package that operate at high frequencies, high voltages, and high temperatures. The use of the glass substrate also facilitates the fabrication of high power density electronics packages.

Additionally, in embodiments where the glass substrate is provided as a multi-thickness substrate, one or more semiconductor devices and other electronic components may be hermetically sealed in a cavity formed between the glass substrate and multi-layer substrate. Such a hermetic environment extends the high temperature reliability of the SiC or other high temperature semiconductor devices and the adhesive that is used to attach the devices to the glass substrate. The ability to provide a hermetic seal also alleviates the need to provide an encapsulant or other underfill material surrounding the semiconductor devices, thereby reducing material and processing costs. Embodiments incorporating a multi-thickness glass substrate also provide through interconnections in the form of metalized vias through the thicker portions of the glass substrate, which replace electrically conductive shims and reduce manufacturing steps.

Therefore, according to one embodiment of the invention, an electronics package includes a glass substrate having an exterior portion surrounding an interior portion thereof, wherein the interior portion has a first thickness and the exterior portion has a second thickness larger than the first thickness. The electronics package further includes an adhesive layer formed on a lower surface of the interior portion of the glass substrate and a semiconductor device having an upper surface coupled to the adhesive layer, the semiconductor device having at least one contact pad disposed on the upper surface thereof. A first metallization layer is coupled to an upper surface of the glass substrate and extends through a first via formed through the first thickness of the glass substrate to couple with the at least one contact pad of the semiconductor device.

According to another embodiment of the invention, a method of manufacturing an electronics package includes providing a glass substrate having an interior portion surrounded by an exterior portion, the exterior portion having a thickness greater than a thickness of the interior portion. The method also includes forming an adhesive layer on a lower surface of the interior portion of the glass substrate, coupling an upper surface of a semiconductor device to the glass substrate by way of the adhesive layer, the upper surface comprising at least one contact pad, and forming a first metallization layer on the glass substrate, the first metallization layer extending through at least one via formed through the thickness of the interior portion of the glass substrate to connect to the at least one contact pad of the semiconductor device.

According to yet another embodiment of the invention, a power electronics package includes a multi-thickness substrate having at least one via formed through a first thickness thereof and a power device having an active surface coupled to the multi-thickness substrate, the active surface comprising at least one contact pad aligned with the at least one via in the multi-thickness substrate. A first metallization layer is formed on an upper surface of the multi-thickness substrate and extends through the at least one via to contact the at least one contact pad. The difference between the coefficient of thermal expansion of the multi-layer substrate and the coefficient of thermal expansion of the power device is less than approximately 7 ppm/° C.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An electronics package comprising:
    a glass substrate having an exterior portion surrounding an interior portion thereof, wherein the interior portion has a first thickness and the exterior portion has a second thickness larger than the first thickness;
    an adhesive layer formed on a lower surface of the interior portion of the glass substrate;
    a semiconductor device having an upper surface coupled to the adhesive layer, the semiconductor device having at least one contact pad disposed on the upper surface thereof;
    a first metallization layer coupled to an upper surface of the glass substrate and extending through a first via formed through the first thickness of the glass substrate to couple with the at least one contact pad of the semiconductor device; and
    a conductive substrate having a first portion coupled to a lower surface of the semiconductor device and a second portion coupled to the exterior portion of the glass substrate.

2. The electronics package of claim 1 wherein a difference between the coefficient of thermal expansion of the glass substrate and the coefficient of thermal expansion of the semiconductor device is equal to or less than 7 ppm/° C.

3. The electronics package of claim 1 wherein the semiconductor device comprises a power device.

4. The electronics package of claim 1 further comprising a second metallization layer coupled to a lower surface of the exterior portion of the glass substrate;
    wherein the first metallization layer and the second metallization layer electrically connect within a second via formed through the second thickness of the glass substrate.

5. The electronics package of claim 4 further comprising a passive device coupled to the adhesive layer; and
    wherein the passive device is electrically connected to the first metallization layer.

6. The electronics package of claim 1 further comprising a conductive shim positioned adjacent a bottom surface of the glass substrate and electrically coupled to the first metallization layer.

7. The electronics package of claim 1 further comprising:
    a conductive substrate coupled to a lower surface of the semiconductor device; and
    a second joining layer positioned between the conductive substrate and the exterior portion of the glass substrate, the second joining layer surrounding at least a subsection of the interior portion of the glass substrate.

8. The electronics package of claim 7 wherein the second joining layer comprises a material that hermetically seals the semiconductor device within an interior cavity of the electronics package.

9. The electronics package of claim 7 wherein the second joining material is directly coupled to the lower surface of the outer portion of the glass substrate.

10. The electronics package of claim 7 further comprising an encapsulant that fills a cavity positioned between the glass substrate and the conductive substrate and surrounds the semiconductor device.

11. A method of manufacturing an electronics package comprising:
    providing a glass substrate having an interior portion surrounded by an exterior portion, the exterior portion having a thickness greater than a thickness of the interior portion;
    forming an adhesive layer on a lower surface of the interior portion of the glass substrate;
    coupling an upper surface of a semiconductor device to the glass substrate by way of the adhesive layer, the upper surface comprising at least one contact pad;
    coupling a first portion of a conductive substrate to a lower surface of the semiconductor device;
    coupling a second portion of the conductive substrate to the exterior portion of the glass substrate; and
    forming a first metallization layer on the glass substrate, the first metallization layer extending through at least one via formed through the thickness of the interior portion of the glass substrate to connect to the at least one contact pad of the semiconductor device.

12. The method of claim 11 further comprising:
    coupling a bottom surface of the semiconductor device to a conductive substrate using a first joining layer, the conductive substrate comprising a ceramic layer with metal structures applied thereto; and
    coupling the outer portion of the glass substrate to the conductive substrate using a second joining layer.

13. The method of claim 12 further comprising coupling a bottom surface of the outer portion of the glass substrate directly to the conductive substrate using a glass frit or liquid crystalline polymer bond.

14. The method of claim 11 further comprising forming a second metallization layer on a bottom surface of the exterior portion of the glass substrate.

15. The method of claim 14 further comprising electrically coupling the first metallization layer to the second metallization layer through a via that extends through the thickness of the exterior portion of the glass substrate.

16. The method of claim 15 further comprising:
coupling a passive device to the glass substrate by way of the adhesive layer; and
electrically coupling the passive device to the first metallization layer and to the second metallization layer.

* * * * *